April 22, 1969 B. T. WALKER 3,439,854

APPARATUS FOR SOLDERING PRINTED CIRCUIT PANELS

Filed April 25, 1966

Inventor
Brian T. Walker
By Kemon, Palmer, Stewart & Estabrook
Attorneys

United States Patent Office 3,439,854
Patented Apr. 22, 1969

3,439,854

APPARATUS FOR SOLDERING PRINTED CIRCUIT PANELS

Brian Thomas Walker, Luton, England, assignor to British Aircraft Corporation (Operating) Limited, a British company Filed Apr. 25, 1966, Ser. No. 544,743
Claims priority, application Great Britain, Apr. 28, 1965, 17,887/65
Int. Cl. B23k *1/08*
U.S. Cl. 228—34 1 Claim

ABSTRACT OF THE DISCLOSURE

A wave soldering apparatus for printed circuit boards is disclosed in which the carrier which moves the board across the solder wave also supports a flux plate immediately ahead of the circuit board and in the same horizontal plane so that the flux plate picks up flux from the flux bath and contacts the solder wave just ahead of the printed circuit board.

In one known method of soldering components to printed circuits, the surface of a board which bears the printed pattern and through which project the pins of components to be connected into the pattern, is coated with flux and is then passed over a wave of molten solder. The molten solder is pumped through a fishtail nozzle extending transversely to the direction of movement of the printed circuit board and emerges as a smoothly rounded wave spilling over the exit of the nozzle.

According to the present invention, a metallic plate coated with flux is passed over the solder wave so as to contact the latter immediately before the board reaches the wave; this fluxed plate has the effect of skimming off the dross on the solder wave and depositing flux on the wave surface immediately before the wave encounters the contacts to be soldered. I have found that in this way the deposition of the solder to form the connections on the printed circuit board is greatly improved and that the solder is deposited with greater accuracy. This means that the spacing between the conductor lines on the printed circuit can be made smaller without risk of the deposition of blobs of solder large enough to short circuit the conductor lines, and thus provides a further advance in the process of miniaturisations. In the preferred arrangement, a carrier which supports the board to be soldered also supports the metallic plate which precedes the board, flux being deposited on the plate and board by a further nozzle located earlier in the path of the carrier than the solder nozzle.

In order that the invention may be better understood, one example will now be described with reference to the accompanying drawings, in which:

FIGURE 1 shows a printed circuit board 10 from the underside of which project pins 11 of components located on the upper side of the board. These pins have to be soldered to the metallic printed pattern on the circuit board.

Figure 1:
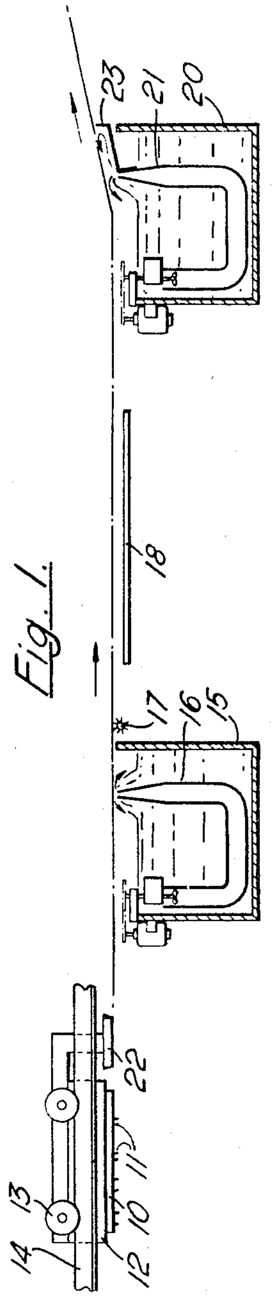
FIGURE 1 shows diagrammatically a production line for soldering the connections on the printed circuit board.

The board is supported by a carrier 12, the wheels 13 of which run on rails 14 which guide the carrier along the production line. The carrier first passes fluxing apparatus including a flux container 15 in which is located a nozzle 16 having an inlet below the surface of the flux and an outlet which extends in a direction perpendicular to the direction of movement of the printed circuit board. A pump drives flux through the nozzle 16 so that it overflows from the top of the nozzle in a rounded wave and falls back into the container 15.

After skimming over the flux wave, the printed circuit board encounters a brush 17 which removes surplus flux. The board then passes over heater rods 18 and on to a solder delivery apparatus similar in many respects to the fluxing apparatus earlier in the production line. The solder is contained in a container 20 and is driven through a nozzle 21 to form a wave overflowing from the nozzle and contacting the surface of the printed circuit board as it passes along the production line. Solder is deposited on to the fluxed metallic portions to be joined.

Attached to the carrier which supports the printed circuit board is a flux plate 22. This plate precedes the printed circuit board as it passes over the flux and solder waves. It is therefore coated with flux when it reaches the solder wave, and as the flux plate passes over the solder wave it removes the dross from the surface of the wave and deposits flux on to the wave surface. This flux spreads over the full length of the surface of the solder wave and the resulting flux film prevents further dross from forming by oxidation of the solder in the interval between the passage of the flux plate and the passage of the printed circuit board.

In the example shown the nozzle of the soldering machine is so shaped that the solder which contacts the board flows in a direction opposite to the direction of travel of the board. This feature, which provides a further improvement in the resulting soldered connections is the subject of the copending application No. 544,760 now Patent No. 3,407,984, issued Oct. 29, 1968. The flux deposited by the flux plate extends over the full length of the solder wave up to the end lip 23 which reverses the direction of flow of the solder.

After passing the solder wave, the printed circuit board travels along an upwardly inclined path. We have found that an angle of inclination of about 8½ degrees with a travel speed of the panel of about 5½ feet per minute gives satisfactory results. The direction of flow of the solder and the upward inclination of the path as the panel passes over the solder machine tends to prevent the formation of "icicles" of solder, due to the downward dragging of the solder by the trailing portion of the solder wave. These icicles might otherwise be sufficiently large to bridge the gap between conductors.

Figure 2:
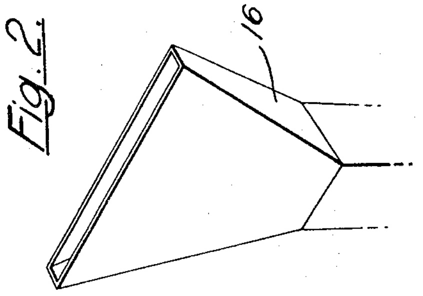
FIGURE 2 shows the form of the nozzle in the flux machine.

As shown in FIGURE 2, the nozzle of the fluxing device diverges to its exit in fishtail fashion in the direction perpendicular to the direction of travel of the carrier, the convergence in the view shown in FIGURE 1 ensuring that the cross-sectional area is substantially constant. The solder nozzle is similar except for the lip 23.

Figure 3:
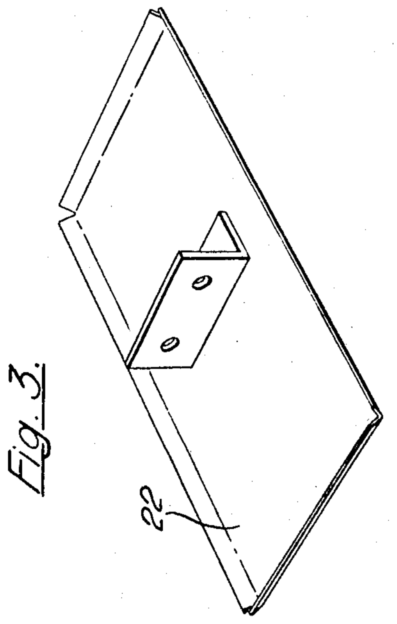
FIGURE 3 shows the flux plate which is attached to the carrier.

FIGURE 3 shows the form of the flux plate 22, which is of thin sheet metal and is provided with flanges.

I claim:

1. Apparatus for wave soldering parts to be connected mounted on a board, comprising:

- a carrier for the board having parts thereon to be connected;
- means for guiding said carrier along a predetermined path;
- a flux wave generator arranged under said path so that its flux wave contacts the parts to be connected as the carrier moves along the path;
- a solder wave generator also arranged under said path and downstream of said flux wave generator, so that its solder wave contacts the parts to be connected as said carrier moves along said predetermined path;

a flux plate supported by said carrier in the same plane as and downstream of the board, so that as said carrier moves along said path, said flux plate contacts the flux wave of said flux wave generator ahead of the board and then the solder wave of said solder wave generator to skim the surface of the solder wave and deposit flux on the emerging solder immediately preceding the arrival of the board at said solder wave generator;

whereby the board having parts to be connected is contacted by a flow of solder which is clean of all dross and which has some flux on its surface.

References Cited

UNITED STATES PATENTS

| | | | |
|---|---|---|---|
| 2,869,497 | 1/1959 | Lehner | 29—503 X |
| 3,053,215 | 9/1962 | Guty | 29—503 X |
| 3,092,059 | 6/1963 | Tesch | 29—503 X |
| 3,218,193 | 11/1965 | Isaacson | 228—37 X |
| 3,277,566 | 10/1966 | Christenson. | |

JOHN F. CAMPBELL, *Primary Examiner.*

J. L. CLINE, *Assistant Examiner.*

U.S. Cl. X.R.

29—495, 496, 471.1, 626; 228—37